United States Patent [19]

Kudoh et al.

[11] Patent Number: 5,248,854
[45] Date of Patent: Sep. 28, 1993

[54] MULTILEVEL METALLIZATION FOR VLSI AND METHOD FOR FORMING THE SAME

[75] Inventors: Osamu Kudoh; Kenji Okada; Hiroshi Shiba, all of Tokyo, Japan

[73] Assignee: NEC Corporation, Tokyo, Japan

[21] Appl. No.: 505,322

[22] Filed: Apr. 5, 1990

[30] Foreign Application Priority Data

Apr. 5, 1989 [JP] Japan .................... 1-87513

[51] Int. Cl.$^5$ ............................................ H05K 1/00
[52] U.S. Cl. ........................ 174/261; 361/778
[58] Field of Search ............. 174/250, 261, 262, 263, 174/264; 361/410, 416; 427/96, 97; 29/590, 591; 357/71, 70

[56] References Cited

U.S. PATENT DOCUMENTS

| | | | |
|---|---|---|---|
| 3,718,936 | 2/1973 | Rice, Jr. ................... | 174/262 X |
| 3,757,028 | 9/1973 | Schlessel .................. | 174/262 X |
| 4,371,744 | 2/1983 | Badet ....................... | 361/410 X |
| 4,424,251 | 1/1984 | Sugishita et al. .......... | 361/410 X |
| 4,487,993 | 12/1984 | Becker ..................... | 174/264 |
| 4,543,715 | 10/1985 | Iadarola ................... | 427/97 X |
| 4,601,915 | 7/1986 | Allen ....................... | 427/96 |
| 4,614,021 | 9/1986 | Hulseweh .................. | 29/590 |
| 4,888,665 | 12/1989 | Smith ....................... | 361/414 X |

FOREIGN PATENT DOCUMENTS 0129389 12/1984 European Pat. Off. .
2353276 10/1973 Fed. Rep. of Germany ...... 174/264

OTHER PUBLICATIONS

Jarvela, R. A. and M. J. Jesrani, *Wirability Enhancement*, IBM Technical Disclosure Bulletin, vol. 21, No. 9, Feb. 1979, p. 3624.
European Search Report.
IEEE VLSI Multilevel Interconnect Conf. 1988, Jun. 13–14, 1988, pp. 117–124, K. Haberle et al., "Multilevel Gold Metallisation".

*Primary Examiner*—Leo P. Picard
*Assistant Examiner*—Trinidad Korka
*Attorney, Agent, or Firm*—Sughrue, Mion, Zinn, Macpeak & Seas

[57] ABSTRACT

An interlayer connection structure for an integrated circuit includes a substrate, a first level horizontal conductor formed on the substrate, an interlayer insulator formed to cover the first level conductor, a second level horizontal conductor formed on the interlayer insulator, and a vertical conductive pillar extending through the interlayer insulator for interconnecting the first level horizontal conductor and the second level horizontal conductor. The vertical conductive pillar has a side surface coplanar with a longitudinal side surface of the first level horizontal conductor at a position where the vertical conductive pillar is in electric contact with the first level horizontal conductor.

1 Claim, 5 Drawing Sheets

MULTILEVEL METALLIZATION FOR VLSI AND METHOD FOR FORMING THE SAME

BACKGROUND OF THE INVENTION

1. Field of the Invention

The present invention relates to a multilevel metallization and a method for forming the same, and more specifically to an improved pillar structure for interconnection between two different levels of wiring conductors, and a method for forming the improved pillar connection.

2. Description of Related Art

In the prior art, a vertical connection between two different levels of wiring conductors in a multilevel metallization has been effected by completely charging a conducting material into a through hole or via hole formed in an interlayer insulating layer, by vacuum evaporation or by sputtering. However, an advanced integrated circuit technology, particularly, an increased integration density of the integrated circuit has made it difficult to realize a stable interlayer interconnection by means of through holes. In order to overcome this problem, it has been proposed to previously form a stud-like connection member, often called a "pillar", on a lower level metallization so as to vertically protrude from the lower level metallization, whereby a good interlayer connection between the lower level metallization and an upper level metallization can be realized by the conductive pillar vertically protruding from the lower level metallization.

Referring to FIGS. 1 and 2, there is diagrammatically shown a typical example of a conventional conductive pillar vertically protruding from the lower level metallization. As shown in FIG. 1, a plurality of lower level conductors 12 are formed on a semiconductor substrate 10, and a conductive pillar 14 is formed on the lower level conductor 12 at a pillar connection portion 16 where a through hole 18 is to be formed in an interlayer insulator (not shown) which is to be formed to cover the lower level conductors 12 for the purpose of interconnection between the lower level conductors 12 and an upper level conductor (not shown) to be formed on the interlayer insulator. As seen from FIG. 2, however, in order to previously ensure a tolerance of alignment and to compensate for variation of dimensional accuracy in the semiconductor process, it has been necessary to widen the portion 16 of the lower level conductor 12 where the pillar 14 is formed with the result that a conductor pattern pitch (line pitch) must be enlarged. For example, assuming that a width of each conductor 12 is "F" at a portion excluding the pillar connection portion 16 and "2F" at the pillar connection portion 16, and that a minimum space between each pair of adjacent conductors is "F", the conductor pattern pitch must be "3F". In other words, it is disadvantageous in that the wiring density has been decreased.

Recently, K. Haberle et al. proposed has, in Proceedings of IEEE V-MIC Conference, 1988, pp117–124, that the wiring conductors and the pillars are formed of gold metallization so as to reduce the wiring pitch. Referring to FIGS. 3 and 4, there is diagrammatically shown a conductive pillar proposed by K. Haberle et al. As shown in FIG. 4, a through hole 18A is formed to have a size larger than the width of the lower level conductor 12 formed on the substrate 10, and then, as shown in FIG. 3, a pillar 14A is formed to straddle the lower level conductor 12 by means of a gold plating method.

In this method, assuming that the width of each lower level conductor 12 is "F" and the width of the pillar 14A is "2F" in a direction perpendicular to the longitudinal direction of the lower level conductor 12, the wiring pitch (line pitch) can be made "2.5F", which is shorter than the example shown in FIGS. 1 and 2. However, due to possible misalignment of mask patterns and due to variations of the shape of the pillar, there is an danger of short-circuiting between adjacent conductors or another danger of increasing a wiring capacitance even if the adjacent conductors are not short-circuited. In other words, in order to avoid these dangers, the wiring pitch (line pitch) cannot be sufficiently reduced.

SUMMARY OF THE INVENTION

Accordingly, it is an object of the present invention to provide an interlayer connection structure for an integrated circuit, which overcomes the above mentioned defects of the conventional apparatus.

Another object of the present invention is to provide an interlayer connection structure of the pillar type, which can reduce the wiring pitch as compared with the conventional apparatus.

Still another object of the present invention is to provide a method of forming an interlayer connection structure of the pillar type, which method reduces the wiring pitch as compared with conventional methods.

The above and other objects of the present invention are achieved in accordance with the present invention by an integrated circuit including a substrate, a first level horizontal conductor formed on the substrate, an interlayer insulator formed to cover the first level conductor, a second level horizontal conductor formed on the interlayer insulator, and a conductive pillar extending through the interlayer insulator for interconnecting the first level horizontal conductor and the second level horizontal conductor, the conductive pillar having a pair of opposite side surfaces coplanar with a pair of corresponding longitudinal side surfaces of the first level horizontal conductor at a position where the conductive pillar is in electric contact with the first level horizontal conductor.

According to another aspect of the present invention, there is provided a method of forming an interlayer connection conductor in an integrated circuit, comprising the steps of depositing a first photoresist layer on the conducting layer and patterning the deposited first photoresist layer to form in the deposited first photoresist layer a groove for formation of a lower level wiring conductor, forming within the groove a first level wiring conductor having a thickness smaller than that of the deposited first photoresist layer, forming a second photoresist to cover an area including the first level wiring conductor, forming an opening in the second photoresist above the lower level wiring conductor at a predetermined position where the lower level wiring conductor is to be interconnected with a possible upper level wiring conductor, so that a portion of the lower level wiring conductor is exposed through the opening, the opening having a size larger than a width of the lower level wiring conductor, and forming a conductive pillar within the opening, so that the conductive pillar is formed in the groove above the lower level wiring conductor.

As seen from the above descriptions the interlayer connection structure in accordance with the present invention for an integrated circuit is such that a pair of opposite side surfaces of the conductive pillar vertically extruding from the first level horizontal conductor are coplanar with a pair of corresponding longitudinal side surfaces of the first level horizontal conductor, respectively. This means that the dimension of the conductive pillar in a width direction of the first level horizontal conductor is the same as the width of the first level horizontal conductor, and accordingly, the wiring pitch can be determined by the width of the first level horizontal conductor and therefore can be reduced as compared with the conventional apparatus.

In addition, in the method in accordance with the present invention for forming the interlayer connection structure, the lower level wiring conductor and the conductive pillar are formed within the groove formed in the deposited first photoresist layer. This means that the conductive pillar is formed in a self-alignment with the lower level wiring conductor by action of the groove formed in the deposited first photoresist layer. Therefore, the wiring pitch can be reduced to a limit determined by a photolithography. In other words, the wiring pitch can become free from a tolerance margin for misalignment and a dimensional error of semiconductor process, which were causes for increasing the wiring pitch in the prior art.

The above and other objects, features and advantages of the present invention will be apparent from the following description of a preferred embodiment of the invention with reference to the accompanying drawings.

DESCRIPTION OF THE PREFERRED EMBODIMENT

Referring to FIGS. 5A to 5E, there are shown diagramatic perspective views of an integrated circuit chip for illustrating one embodiment of the pillar type interlayer connection construction forming method in accordance with the present invention.

Figure 1:
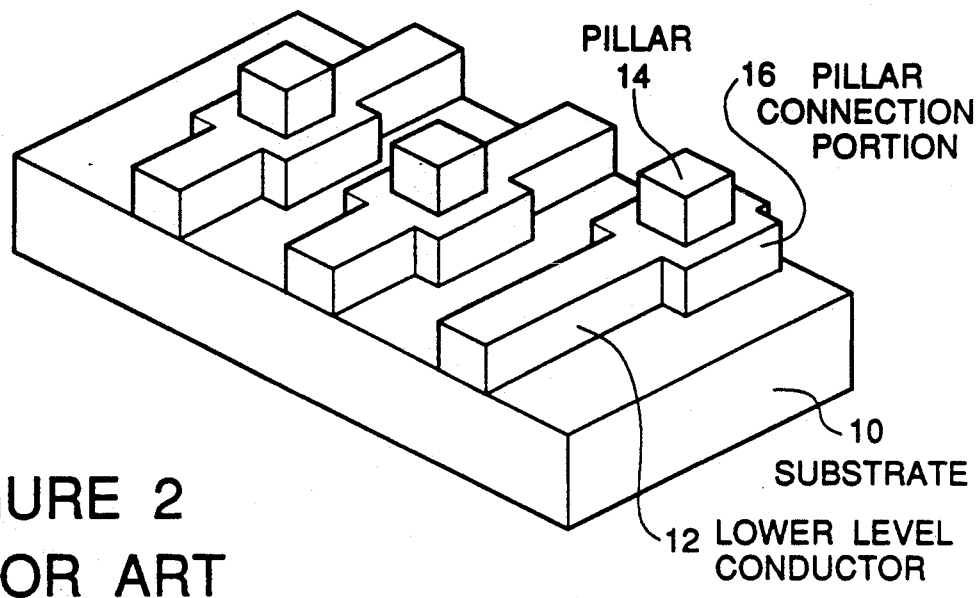
FIG. 1 is a diagrammatic perspective view of one example of the conventional conductive pillar vertically protruding from the lower level conductor in the multilevel metallization.
Figure 2:
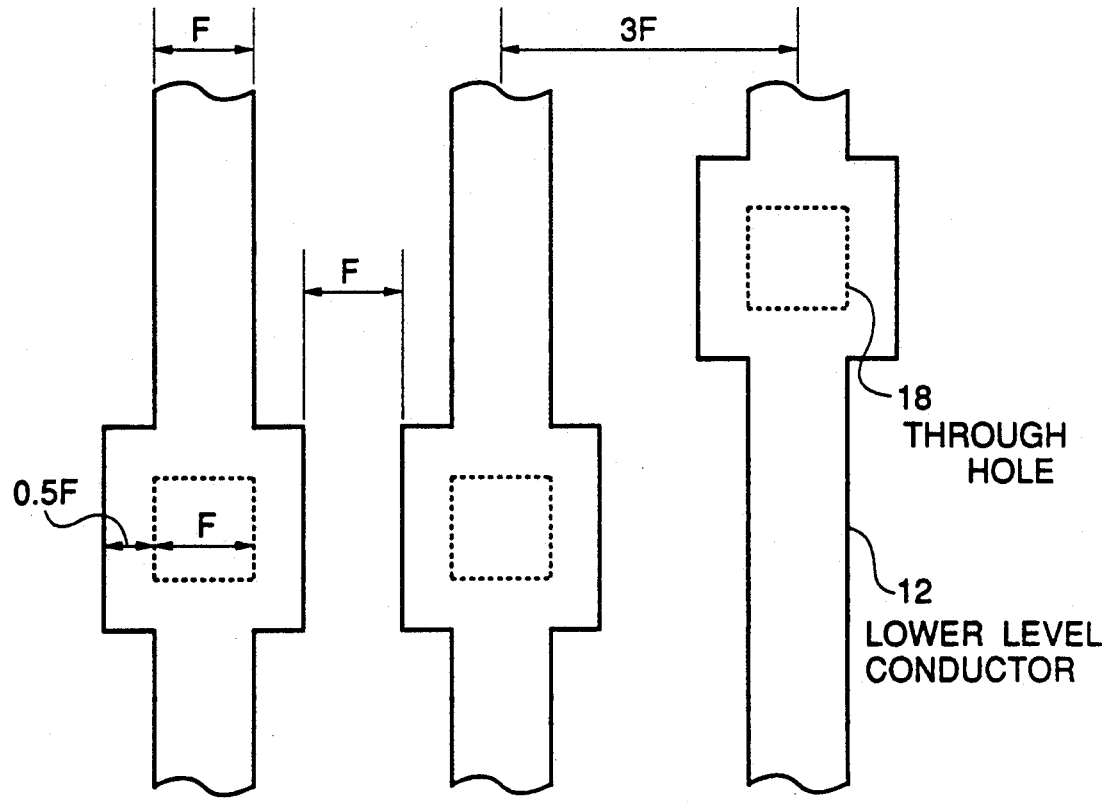
FIG. 2 is a wiring pattern diagram of the lower level conductor and the conductive pillar vertically protruding therefrom as shown in FIG. 1.
Figure 3:
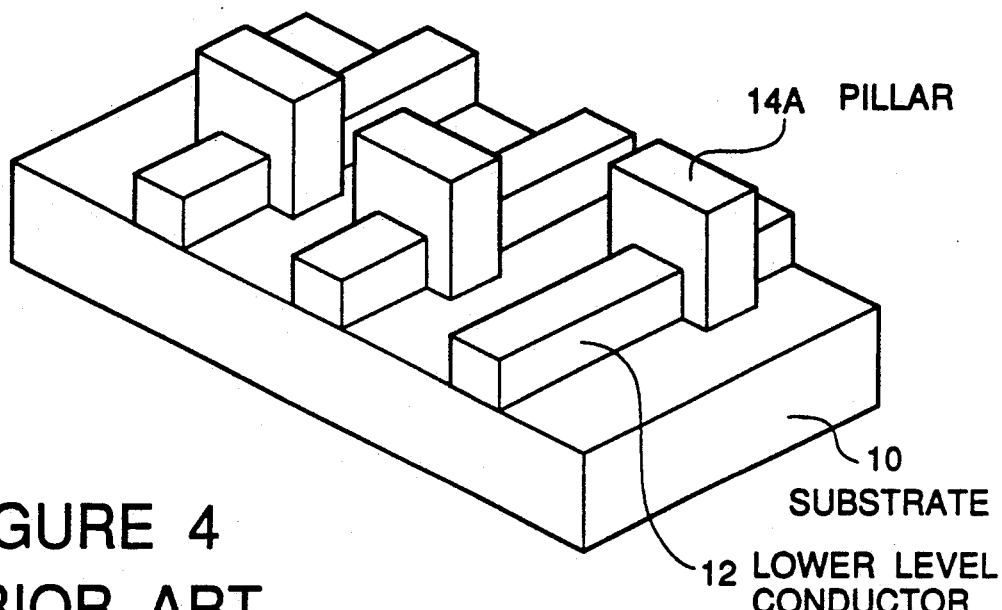
FIG. 3 is a diagrammatic perspective view of another example of the conventional conductive pillar vertically protruding from the lower level conductor in the multilevel metallization.
Figure 4:
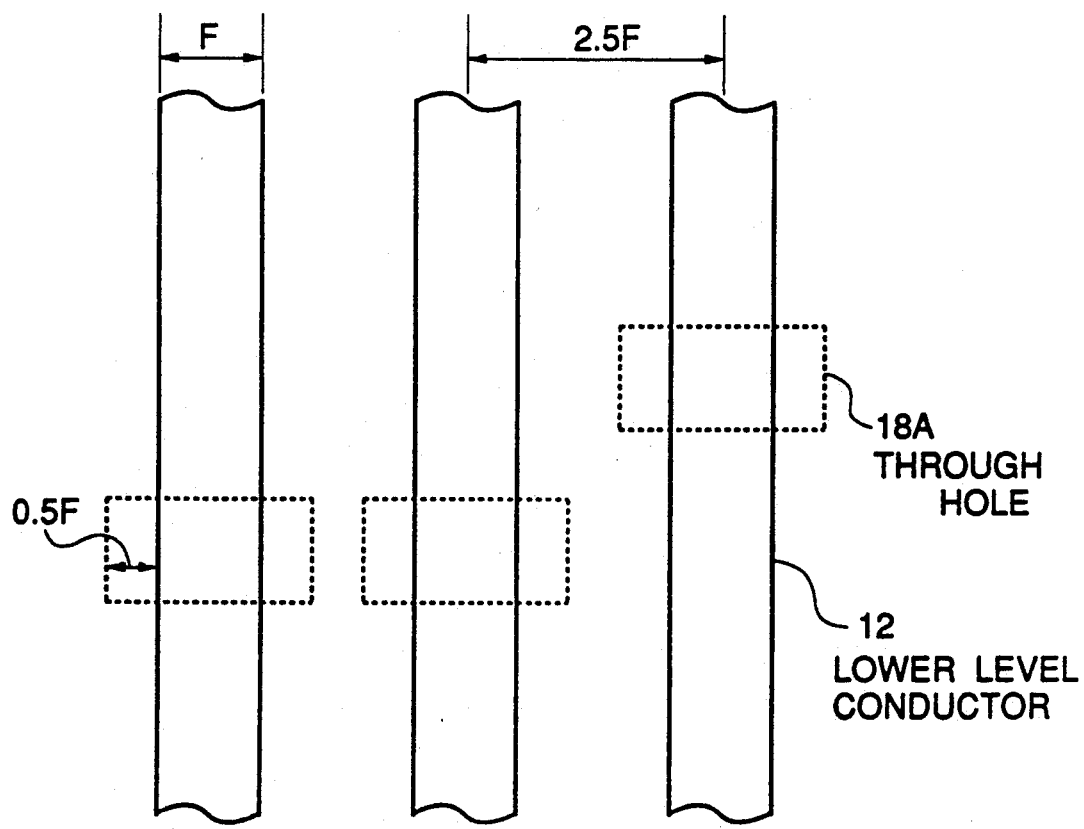
FIG. 4 is a wiring pattern diagram of the lower level conductor and the conductive pillar vertically protruding therefrom as shown in FIG. 3.
Figure 5A:
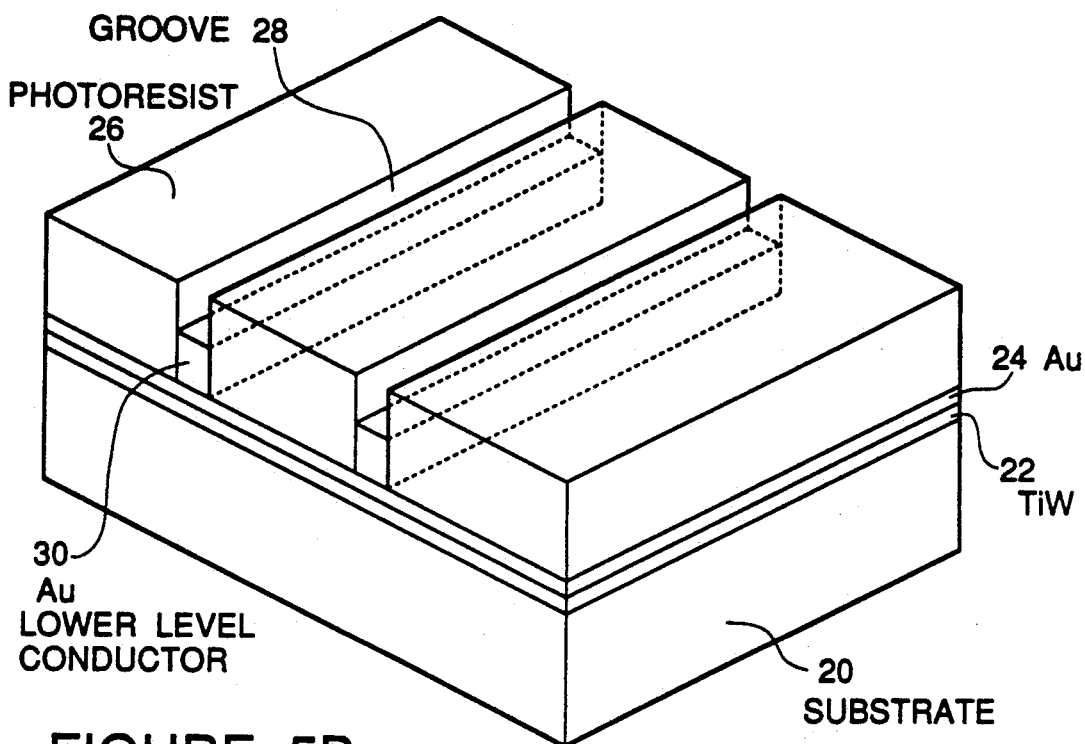
FIGS. 5A to 5E are diagrammatic perspective views of an integrated circuit chip for illustrating one embodiment of the pillar type interlayer connection construction forming method in accordance with the present invention.

Firstly, in order to form a conductive underlayer which is used for forming necessary wiring conductors and vertical conductive pillars on a semiconductor substrate 20 by use of an Au (gold) electroplating method, a thin layer 22 of TiW and another thin layer 24 of Au are continuously deposited on a principal surface of the semiconductor substrate 20 by sputtering. Thereafter, a first photoresist 26 is deposited to cover the whole of the principal surface of the semiconductor substrate 20 and to have a thickness of 2.0 $\mu$m, and the deposited first photoresist is patterned by a photolithography to form a plurality of grooves 28 for a lower level conductor, so that the underlying Au thin layer 24 is exposed within the grooves 28. Then, as shown in FIG. 5A, a first or lower level conductor 30 of Au having a thickness of 0.8 $\mu$m is formed within each groove 28, namely deposited on the exposed underlying Au thin layer 24 within each groove 28, by means of the Au electroplating method using the conducting underlayer 24 as an electrode to be plated. This Au electroplating method is described in detail in the K. Haberle et al article referred to hereinbefore, and therefore, a detailed explanation thereof will be omitted.

Figure 5B:
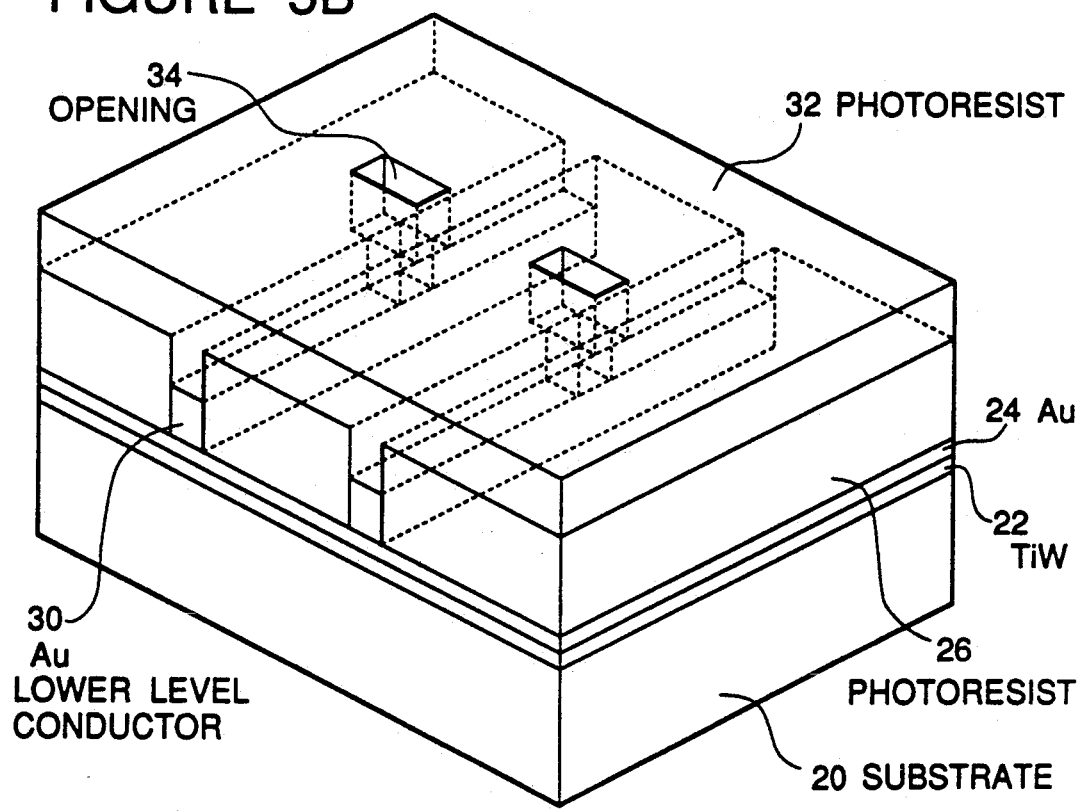
Figure 6:
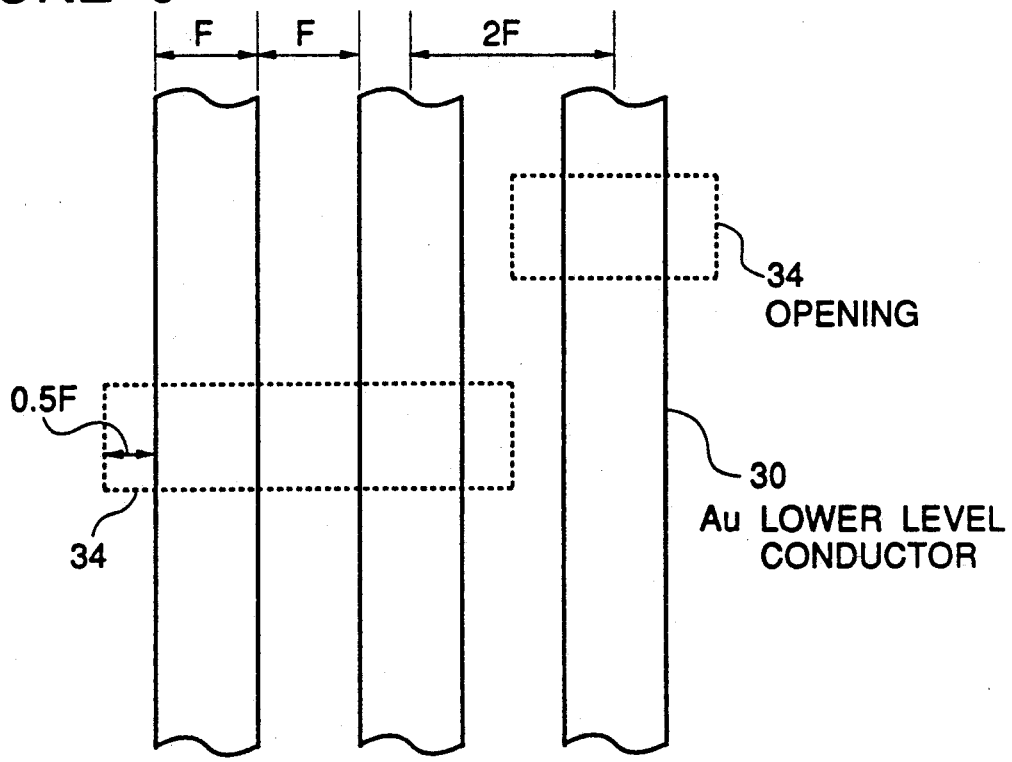
FIG. 6 is a wiring pattern diagram of the lower level conductor and the conductive pillar vertically protruding therefrom formed in the method illustrated in FIGS. 5A to 5E.

As shown in FIG. 5B, a second photoresist 32 is deposited to cover the whole upper surface of the semiconductor substrate 20, with the portion of each groove 28 above the first or lower level conductor 30 being filled with the second photoresist 32. The deposited second photoresist 32 is patterned by a photolithography to form a plurality of openings 34 at predetermined positions where a conductive pillar is to be formed, so that the first or lower level conductor 30 is partially exposed. As shown in FIG. 6, the size of the opening 34 in a direction perpendicular to a longitudinal direction of the first or lower level conductor 30 is larger than the width of the first or lower level conductor 30, namely, the width of the groove 28. Specifically, at a level above a horizontal boundary between the first photoresist 26 and the second photoresist 32, each opening 34 has the size larger than the width of the lower level conductor 30. On the other hand, at a level below the horizontal boundary between the first photoresist 26 and the second photoresist 32, each opening 34 has a size limited by the width of the groove 28, namely, the width of the lower level conductor 30. Accordingly, the relative positioning of the opening 34 to the first or lower level conductor 30 may be at a relatively low degree of accuracy so long as it is assured that the full width of the lower level conductor 30 is exposed within the opening 34. In other words, a center of the opening is not necessarily in precise alignment to a longitudinal center axis of the lower level conductor 30.

Here, it should be noted that, for the photolithography for the second photoresist 32, it is necessary to select a process which gives no damage to the shape of the first photoresist 26. For example, if the first and second photoresists 26 and 32 is of a positive type which contains a Novorak resin as a main component, the first photoresist 26 is cured within a plasma atmosphere, and thereafter, the second photoresist 32 is deposited. With this, the second photoresist 32 can be patterned to a desired shape without causing substantial damage to the shape of the first photoresist 26.

After the formation of the openings 34, Au is deposited by the Au electroplating method using the conducting underlayer 24 as an electrode to be plated, until a first pillar 36 of Au having a height of 0.8 $\mu$m is grown on the lower level conductor 30 within the opening 34. The total height of the lower level conductor 30 and the first pillar 36 is 1.6 $\mu$m, which is smaller than the thickness of the first photoresist 26. Therefore, a pair of opposite side surfaces of the first pillar 36 positioned in a longitudinal direction of the lower level conductor 30 are coplanar with a pair of corresponding opposite longitudinal side surfaces of the lower level conductor 30. In other words, although the opening 34 having the size larger than the width of the lower level conductor 30 is formed in the second photoresist 32, the first pillar 36 is formed in self-alignment with the lower level conductor 30.

Figure 5C:
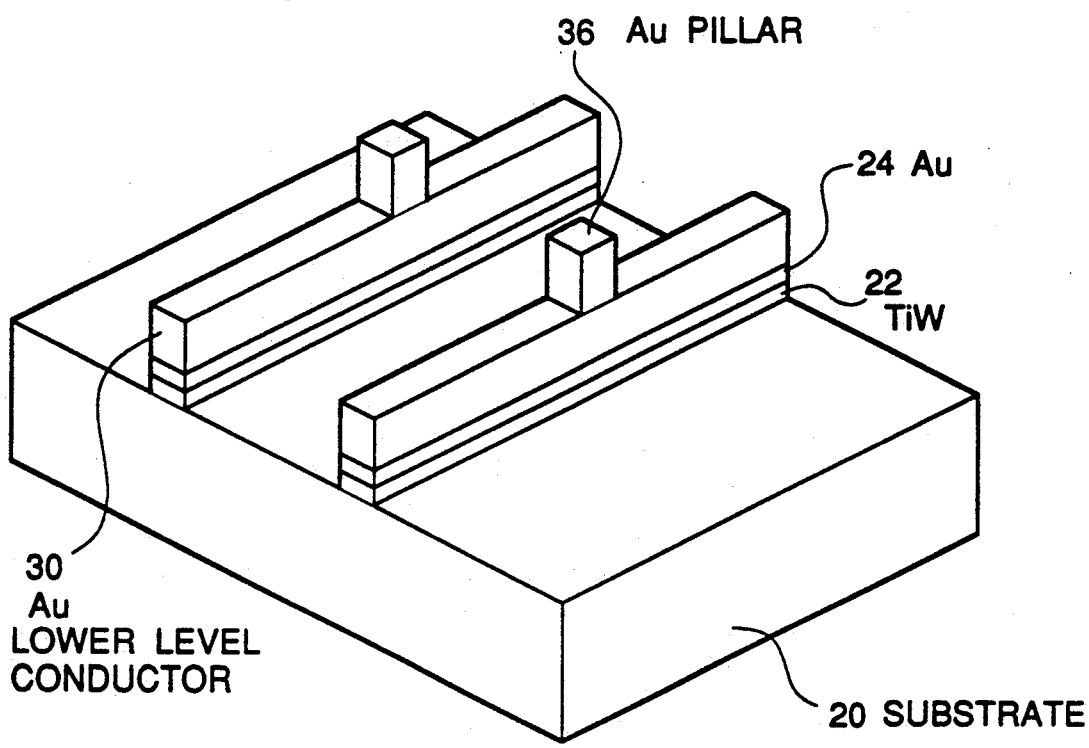

Thereafter, the first and second photoresists 26 and 32 are removed, and then, the exposed underlayer composed of the Au layer 24 and the TiW layer 22 is removed by means of ion milling, as shown in FIG. 5C.

Figure 5D:
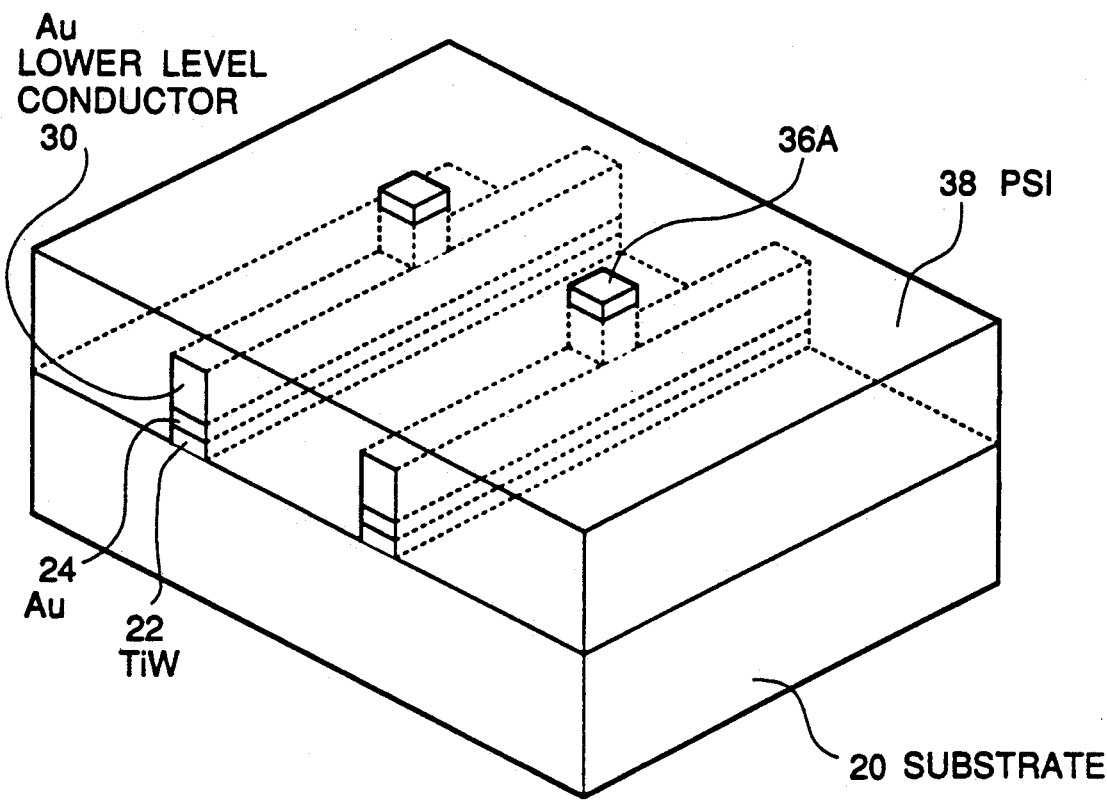

Then, as shown in FIG. 5D, a silicone polyimide (PSI) layer 38 is deposited as an interlayer insulator on the whole surface of the substrate, and etched back by means of an entire etch-back process until a head portion 36A of the first pillar 36 is exposed above the silicone polyimide layer 38 so that the exposed portion has a height of 0.2 μm.

Figure 5E:
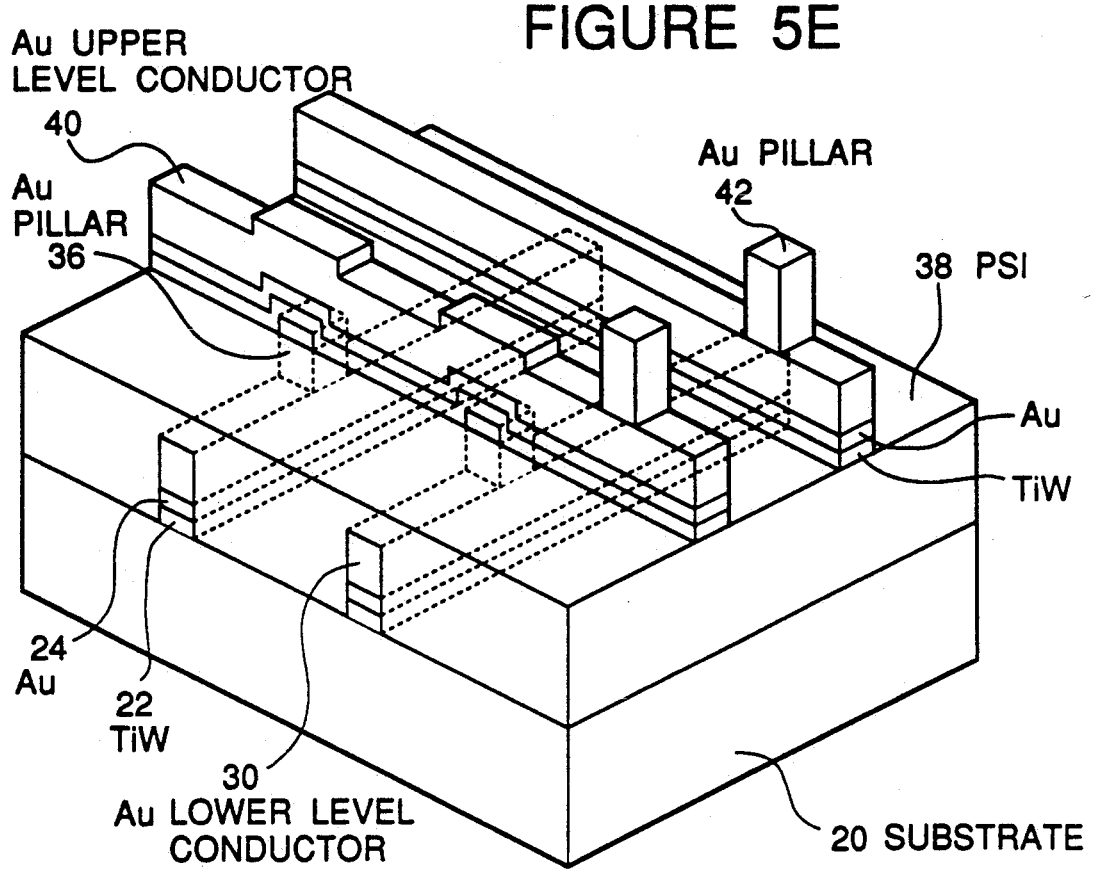

Thereafter, as shown in FIG. 5E, a required number of second or upper level conductors 40 and second pillars 42 of Au protruding from the upper level conductors 40 are formed in the same manner as that explained above with reference to FIGS. 5A to 5D. The upper level conductors 40 are formed in a direction orthogonal to the lower level conductors 30, and some of the upper level conductors 40 are formed above and in electric contact with selected ones of the exposed heads 36A of the first pillars 36. The second pillars 42 are formed in self alignment with the upper level conductors 40. Therefore, the upper level conductors 40 can be formed with the wiring pitch (line pitch) of 2F, similarly to the lower level conductors 30.

The process as mentioned above can be repeatedly performed. Therefore, a multilevel metallization can be realized with a desired number of levels and with a minimum wiring pitch (line pitch) allowed by the photolithography. Accordingly, a maximum wiring density can be obtained.

The invention has thus been shown and described with reference to the specific embodiment. However, it should be noted that the present invention is in no way limited to the details of the illustrated structures but changes and modifications may be made within the scope of the appended claims.

We claim:

1. An integrated circuit comprising:
   a substrate;
   an elongated, patterned, stacked underlayer comprising a TiW layer and an Au layer;
   a first level, horizontal, elongated, patterned conductor formed on said underlayer and extending on and along said underlayer;
   an interlayer insulator formed from silicon polyimide covering said first level conductor;
   a second level, horizontal, elongated, patterned conductor formed on said interlayer insulator; and
   a vertical conductive pillar extending through said interlayer insulator for interconnecting said first level conductor and said second level conductor, said vertical conductive pillar having a pair of opposite side surfaces coplanar to a pair of opposite longitudinal side surfaces of said first level conductor at a position where said vertical conductive pillar is in electric contact with said first level conductor.

* * * * *